United States Patent [19]
Jain

[11] Patent Number: 5,239,550
[45] Date of Patent: Aug. 24, 1993

[54] TRANSISTOR LASERS

[75] Inventor: Faquir C. Jain, Storrs, Conn.

[73] Assignee: University of Connecticut, Storrs, Conn.

[21] Appl. No.: 802,054

[22] Filed: Dec. 3, 1991

[51] Int. Cl.$^5$ .............................................. H01S 3/19
[52] U.S. Cl. ....................................... 372/45; 372/46; 372/48; 372/49; 257/13
[58] Field of Search ...................... 372/45, 46, 48, 49; 357/4, 17; 257/13, 15, 79, 83

[56] References Cited

U.S. PATENT DOCUMENTS

| | | | |
|---|---|---|---|
| 4,819,048 | 4/1989 | Mand et al. | 372/45 |
| 4,943,970 | 7/1990 | Bradley | 372/45 |
| 4,969,152 | 11/1990 | Burghardt et al. | 372/50 |
| 5,034,958 | 7/1991 | Kwon et al. | 372/45 |
| 5,038,356 | 8/1991 | Botez et al. | 372/45 |

FOREIGN PATENT DOCUMENTS

| | | | |
|---|---|---|---|
| 0291192 | 12/1987 | Japan | 372/45 |
| 0079389 | 4/1988 | Japan | 372/45 |
| 0285692 | 11/1990 | Japan | 372/45 |
| 0046384 | 2/1991 | Japan | 372/45 |

OTHER PUBLICATIONS

J-S. Wu, C-Y. Chang, C-P. Lee, K-H. Chang, D-G. Liu, and D-C. Liou, "Characterization of Improved AlGaAs/GaAs Resonant Tunneling Heterostructure Bipolar Transistors", Jap. J. Appl. Physics, 30 pp. L160–L162, Feb. 1991.
T. Futatsugi, Y. Yamaguchi, S. Muto, N. Yokoyama, A. Shibatomi, "Resonant Tunneling Bipolar Transistors Using InAlAs/InGaAs Heterostructures", J. Appl. Phys., 65, 1771–1775 (Feb. 1989).
M. A. Read, W. R. Frensley, R. J. Matyi, J. N. Randall, A. C. Seabaugh "Realization of a Three-Terminal Resonant Tunneling Device: The Bipolar Quantum Resonant Tunneling Transistor", Appl. Phys. Lett. 54 pp. 1034–1037, (Mar. 1989).

*Primary Examiner*—Georgia Y. Epps

[57] ABSTRACT

A transistor laser has a semiconductor collector with a semiconductor substrate and n semiconductor layers thereon, and the substrate is formed of material compatible with the semiconductor layers. Disposed on the collector is a semiconductor base comprising a p layer, and superposed on it is an emitter formed of n semiconductor layers extending the full length of the base and of lesser width than the base. An emitter contact is provided on the outer layer of the emitter, and a base contact is provided on the semiconductor base spaced from the emitter, and a collector contact is provided on the surface of the collector. When potentials are applied between the collector contact and the emitter contact and between the emitter contact and the base contact, a laser beam is generated in the semiconductor base. The assembly may include reflecting dielectric mirrors on the substrate and in the emitter to confine the lasing therebetween. The emitter may include a multiplicity of resonant tunneling layers, and positive distributed feedback may be provided by periodic corrugation on at least one side of the base. The base may be chemically constituted as a strained multiple quantum well layer, or comprised of a series of layers providing multiple quantum wells.

12 Claims, 5 Drawing Sheets

TRANSISTOR LASERS

BACKGROUND OF THE INVENTION

The present invention relates to semiconductor lasers and, more particularly, to semiconductor lasers utilizing transistor-type structures.

Transistors are widely employed in many electronic switching applications and represent a well developed art with a number of possible variations depending upon the particular application.

Similarly, semiconductor lasers employing p-n junctions are now widely employed in many applications and offer design flexibility and ease for optoelectronic triggering. More recently, semiconductor lasers have been proposed which use multiple p-n junctions to generate multiple output beams.

It is an object of the present invention to provide a novel laser heterostructure combining aspects of a semiconductor laser and a semiconductor transistor.

It is also an object to provide such a novel laser heterostructure comprising a heterjunction bipolar transistor (HBT) laser which may be readily fabricated and which may be tailored to provide characteristics optimized for given applications.

Another object is to provide such a novel laser heterostructure combining aspects of a semiconductor laser and a semiconductor transistor which can be triggered electronically by using conventional logic circuits or optically for integration in various optoelectronic integrated circuits (OEICs).

SUMMARY OF THE INVENTION

It has now been found that the foregoing and related objects may be readily attained in a transistor laser comprising a semiconductor collector having a semiconductor substrate and n semiconductor layers thereon with the substrate being formed of material compatible with the semiconductor layers placed thereon. Disposed on the collector is a semiconductor base comprising a p layer, and disposed on the base is an emitter base formed of n semiconductor layers extending the full length of the base and of lesser width than the base.

An emitter contact is provided on the outer layer of the emitter, and a base contact is provided on the semiconductor base spaced from the emitter, and a collector contact is provided on the surface of the collector. When potentials are applied between the conductive contact on the collector and the emitter contact and between the emitter contact and the base contact, a laser beam is generated in the semiconductor base.

In one embodiment, the substrate is semi-insulating and the collector contact is disposed on the lower of the n layers thereof, the lower layer being $n^+$ and the upper layer being $n^-$. In another embodiment, the substrate is semiconducting and the collector contact is disposed on the outer surface thereof, the substrate being $n^+$ and the semiconductor layers thereon being $n^+$ and $n^-$. The laser beam may exit the end of the base, or it may exit through the top or bottom surfaces.

In an embodiment in which it exits through the outer surface of the collector, the substrate is an $n^+$ semiconductor with n and $n^+$ semiconductor layers thereon. The collector also includes semiconductor layers providing a reflecting dielectric mirror on the substrate and the emitter has semiconductor layer providing a reflecting dielectric mirror to thereby confine the lasing therebetween. The collector substrate permits the laser beam to pass through the mirror thereon and to exit therethrough. The dielectric mirrors are realized by quarter wave thick layers of compatible low and high index of refraction semiconductors. The substrate and its ohmic contact may be configured to provide an aperture for the laser beam to exit, or the laser beam generated in the base may be of a wavelength to which the substrate is transparent.

In an edge emitting embodiment, the ends of the base are reflecting to form a cavity therebetween and the laser beam is emitted through one end thereof. In various modifications, the emitter may include a multiplicity of resonant tunneling layers. Positive distributed feedback may be provided by periodic corrugation on at least one side of the base, in which case, the laser beam is emitted through one end thereof. The base may be chemically constituted as a strained multiple quantum well layer, or as layers providing multiple quantum wells.

DETAILED DESCRIPTION OF THE PREFERRED EMBODIMENT

Figure 1:
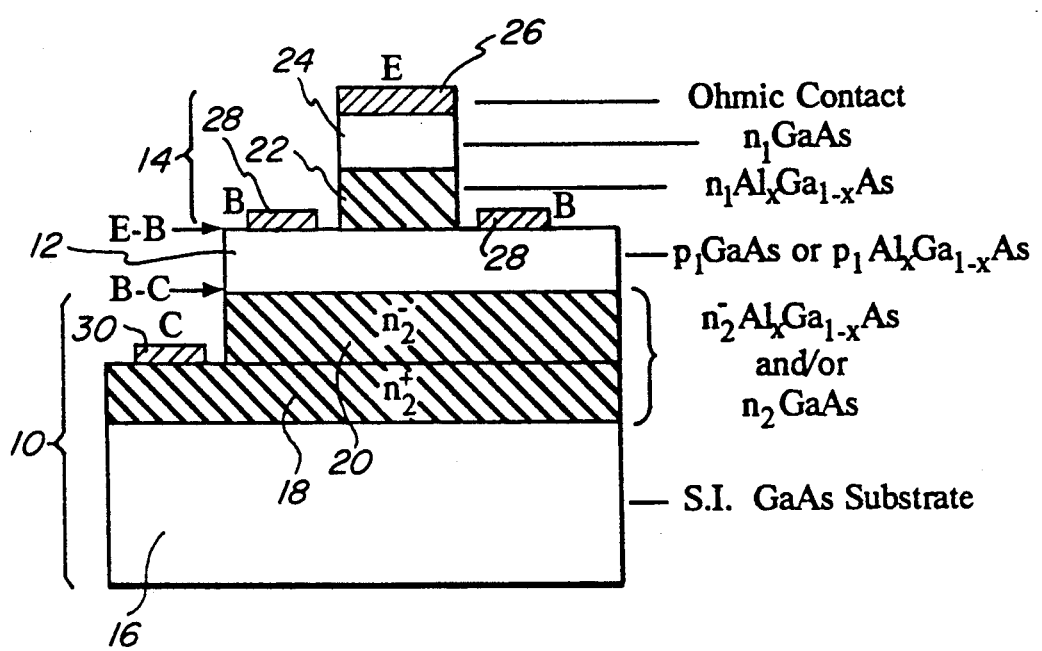
FIG. 1 is a schematic illustration of a transistor laser embodying the present invention and utilizing a semi-insulating substrate and a single quantum well base region.

Turning first to FIG. 1, therein illustrated is a transistor laser embodying the present invention including a collector generally designated by the numeral 10, a base 12 and an emitter stripe generally designated by the numeral 14. In this embodiment, the substrate 16 of the collector 10 is semiinsulating, and the collector includes $n^+$ and $n^-$ semiconductor layers 18, 20 thereon.

The emitter stripe 14 is comprised of a pair of semiconductor layers 22, 24 and the ohmic contact 26 thereon. A pair of base contacts 28 are provided on the upper surface of the base 12 to either side of the emitter 14, and a collector contact 30 is provided on the layer 18 of the collector 10.

The cleaved/etched faces are in the plane of the paper and the laser output is emitted from the $p_1$-base or active layer 12 region under the $n_1$AlGaAs emitter stripe 22. The $n_2$ collector is comprised of lightly doped $n_2^-$ and heavily doped $n_2^+$ regions 20,18, respectively. The design of the collector layer 10 adjoining the base region 12 depends on the selection of base doping, thickness, and material composition. The base 12 may simply be a $p_1$GaAs or $p_1$AlGaAs layer or it may consist of a composite of $p_1$GaAs and $p_1$AlGaAs layers with $p_1$GaAs serving as the active region. In addition, the active layer may be a strained single quantum well layer of InGaAs for achieving low threshold lasers. Recent advancements in the HBT technology reported by P. M. Asbeck et al., *GaAlAs/GaAs Heterojunction Bipolar Transistors: Issues and Prospects for Application*, IEEE Tran. Electron Devices, 36 pp. 2032-2042 (October 1989) and P. D. Rabinzohn et al., *The New Two-Dimensional Electron Gas Base HBT (2 DEG-HBT): Two-Dimensional Numerical Simulation*, IEEE Tran. Electron Devices, 38 pp. 222-231 (February 1991) allows the fabrication of extremely thin base regions ($-0.05$–$0.1$ μm). In addition, transistors using 2-D Gaas simulating the base (therefore approximating a single quantum well base) has been reported by T. Usagawa et al., *A New Two-Dimensional Electron Gas Base Transistor (2 DEG-HBT)*, IEDM Tech. Digest, pp. 78-81 (December 1987).

Figure 2:
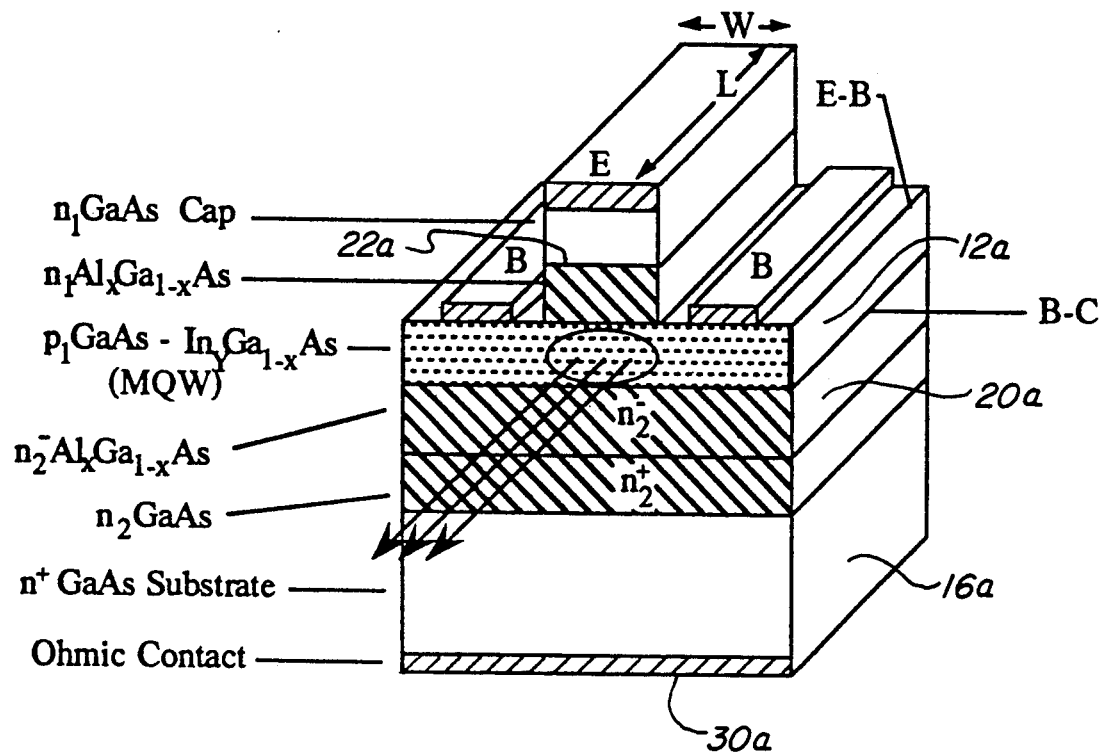
FIG. 2 is a schematic illustration of another embodiment of the present invention in which the active region or base is strained to provide multiple quantum wells and in which the substrate is semiconducting.

Turning next to FIG. 2, a transistor laser is shown in perspective. In this embodiment the base 12a is comprised of p-InGaAs/pGaAs strained multiple quantum wells (MQWs) with lasing wavelength determined by the InGaAs. Bipolar lasers using p-n-p structures can similarly be realized. In addition, one can use distributed feedback structures by incorporating the periodic corrugation either on the emitter or collector side.

The substrate 16a in this embodiment is semiconducting and the collector contact 30a is provided on its lower surface.

The $n_1$AlGaAs emitter stripe injects electroncs in the p-type GaAs base 12a. The injected minority carriers recombine with the majority holes in the base 12a, and constitute a significant part of the base current $I_B$. However, most of the injected electron are collected by the $n_2$AlGaAs collector layer 20a in the form of current $I_C$. The relative magnitudes of $I_C$ and $I_B$ depend on the emitter-base and base-collector biasing and device construction. Unlike a p-n diode, an HBT can be operated in various modes including saturation/quasisaturation or active region. The operating point may be selected in a region which yields the desirable characteristics such as $I_B$ insensitivity to fluctuations in the modulation of the base current (and hence the laser output), and noise considerations.

In an HBT laser, since the base is sandwiched between AlGaAs layers, it provides carrier as well as photon confinements. Therefore, the threshold current density depends on $I_b$, emitter-base junction area and base thickness. The lateral and transverse field distributions are similar to those of diode lasers.

Figure 3:
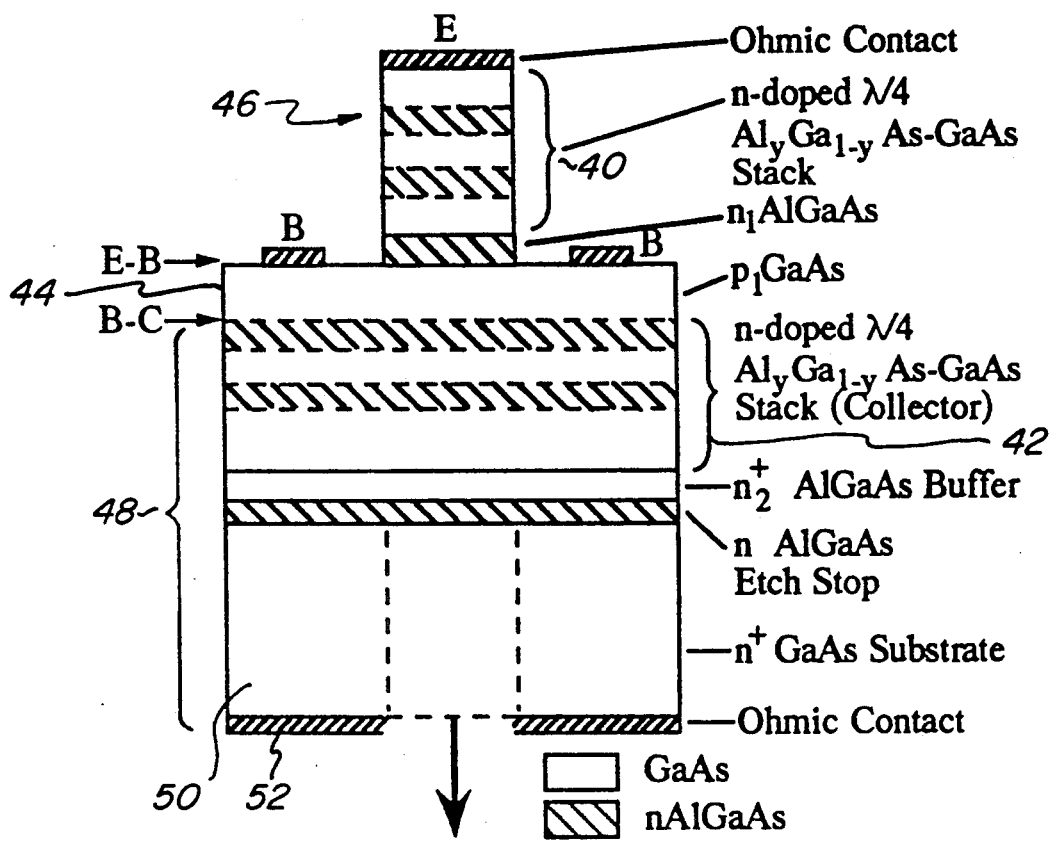
FIG. 3 is a schematic illustration of a surface emitting embodiment of the present invention in which dielectric mirrors are provided in the collector and emitter stripes to define a cavity for the lasing beam therebetween.

Turning next to FIG. 3, the embodiment is surface emitting and uses λ/4 wave stack dielectric mirrors generally designated by the numerals 40, 42 to constitute the cavity sandwiching the p-GaAs or InGaAs (strained leyer) base 44 which serves as the active layer. The mirrors 40, 42 are provided as a part of the emitter stripe generally designated by the numeral 46 and as a part of the collector generally designated by the numeral 48.

In the illustrated embodiment, the laser beam exits the substrate 50 through an aperture in the ohmic contact 52. However, it may exit from the top surface following the methodology discussed by Yang et al in *Single-Mode Operation of Mushroom Structure Surface Emitting Lasers*, IEEE Photonics Technology Letter 3, pp 9-11 (January 1991).

In the case of lasing in an InGaAs layer, no substrate etching is necessary. A vertical coupled-cavity laser can be designed by integrating an additional quarter-wave (AlGaAsGaAs) dielectric mirror between the two λ/4 stacks of FIG. 3. One way to realize this is to follow the p-GaAs active layer by a p-AlGaAs/GaAs λ/4 stack mirror in the base region. The p-AlGaAs-GaAs stack, n-nGaAs collector, and the $n_2$+AlGaAs-GaAs stack form the passive cavity underneath the active layer 44. The coupled-cavity arrangement can be used as an integrated laser-modulator device in which the laser is in the emitter-base part and the modulator is realized in the base-collector region). It may be added that optical modulators in BJT configuration have recently been reported by several investigators including P. M. Asbeck et al, in *GaAlAs/GaAs Heterojunction Bipolar Transistors: Issues and Prospects for Application*, IEEE Trans. Electron Devices, 36, pp 2032-2042, (October 1989). Alternatively, a n+-i(MQW)-p modulator using quantum confined Stark effect (QCSE) can be integrated under the n-type collector (or over the emitter) layer with its own bias/modulation voltage. Here i(MQW) may be realized using InGaAs-GaAs layers between an n+ collector (which may have a separate contact) and a pGaAs substrate. In the case of an InGaAs-GaAs system, the lasing structure should also employ an InGaAs active layer.

The basic bipolar n-p-n cavity-type lasers can be triggered electronically using conventional logic circuits (e.g. TTL) realized on the same substrate. In the case of surface emitting structures, one can visualize a 2-D laser array with integrated logic circuits serving as an optical interconnect between two chips. The integration of optical components such as waveguides, modulators/switches and detectors with the proposed multiple n-junction lasers makes the design of OEICs more versatile.

Figure 4:
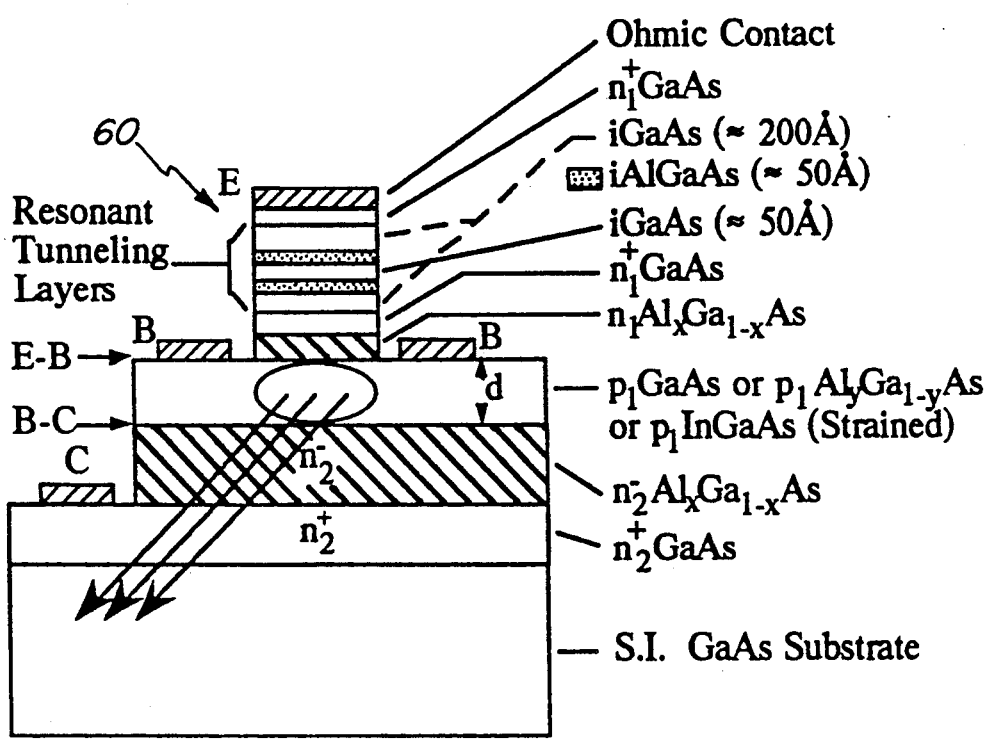
FIG. 4 is a schematic illustration of still another embodiment in which the emitter stripe incorporates resonant tunneling layers.

Turning now to FIG. 4, therein illustrated is a transistor laser employing a resonant tunneling emitter generally designated by the numeral 60. 1 Sandwiched between the upper and lower n+GaAs layers are three layers of GaAs sandwiching two layers of AlGaAs; this provides a negative resistance region. The operation of resonant tunneling transistors is described by Wu et al., *Characterization of Improved AlGaAs/GaAs Resonant Tunneling Heterostructure Bipolar Transistors*, Jap. J. Appl. Physics, 30 pp. L160–L162 (February 1991), and Futatsugi et al., in *Resonant Tunneling Bipolar Transistors Using InAlAs/InGaAs Heterostructures*, J. Appl. Phys., 65, 1771-1775 (February 1989), and in Read et al, *Realization Of A Three-Terminal Resonant Tunneling Device: The Bipolar Quantum Resonant Tunneling Transistor*, Appl. Phys. Lett., 54 pp. 1034-1037 (March 1989) literature. An AlGaAs-GaAs device is described by Wu et al, supra and Futatsugi et al, supra have reported a superior performance InAlAs-InGaAs resonant tunneling transistor with a peak collector current density of $5.7 \times 10^4 A/Cm^2$ and a peak-to-valley ratio of 3.5. The peak base current density, as obtained from the $I_B \times V_{BE}$ plot of Futatsugi et al, is $4.04 \times 10^3 A/cm^2$. This base current density is well above the threshold current density $J_{TH}$ observed in quantum well or conventional double heterostructure (DH) lasers. A peak-to-valley ratio of 3.5 gives it a valley current density of $1.15 \times 10^3 A/cm^2$. This provides a good lasing to nonlasing switching if the valley current magnitude is dropped to a value below the threshold current density $J_{TH}$ and the cutoff frequency of the RT=HBT was reported by Futatsugi et al to be 12.4 GHz, and the tunneling response time of 1.4 ps at room temperature operation.

By modification, resonant tunneling lasers can also function in a surface emitting mode. Resonant tunneling may also be emulated in the base region by a similar sandwiched series of layers.

Figure 5:
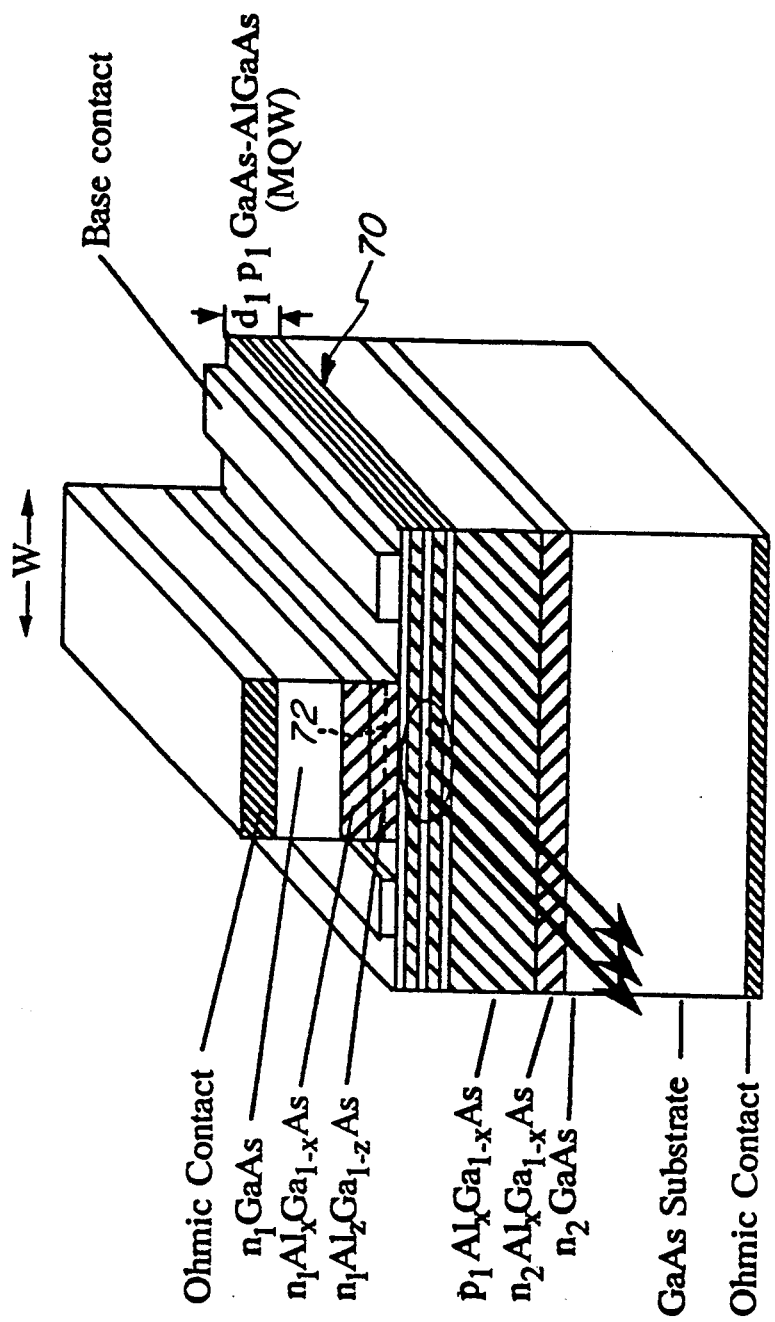
FIG. 5 is a schematic illustration of yet another embodiment in which the base region is comprised of a multiplicity of layers producing multiple quantum wells and in which there is incorporated periodic corrugation at the base of the emitter stripe to provide distributed feedback.

Turning next to FIG. 5, this transistor laser has a multiple quantum wells base region 70 providing by the multiple alternating layers of GaAs and AlGaAs. It also has distributed feedback by reason of the periodic corrugation indicated by the dotted line 72 in the lowermost layer of the emitter.

As will be readily appreciated, other chemistries may be employed for the several layers of the transistor laser, and various combinations of the features heretofore described may be effected to provide the desired characteristics for the device.

The transistor lasers of the present invention may be utilized in a number of optoelectronic applications where switching or modulation is required. The laser outputs may speed up the switching of optoelectronic circuits and provide optical interconnects between integrated circuits. Functioning as a modulator, they may serve to modulate the signals for communication purposes. Multiple surface emitting devices may be utilized in a matrix assembly if so desired, and relatively high powered beams may be produced by collecting and focusing the laser beams from a multiplicity of transistor lasers.

Thus, it can be seen from the foregoing detailed description and the attached drawings that the novel transistor lasers offer unique features and may be readily fabricated and customized to provide desirable characteristics for various optoelectronic applications. The transistor lasers may be edge emitting or surface emitting, depending upon the application, and they may incorporate modulation, multiple quantum well active base layer regions and distributed feedback features.

Having thus described the invention, what is claimed is:

1. A transistor laser comprising:
   (a) a semiconductor collector having a semiconductor substrate and n semiconductor layers thereon, said substrate being formed of material compatible with the semiconductor layers placed thereon;
   (b) a semiconductor base on said collector comprising a p layer;
   (c) an emitter on said base formed of n semiconductor layers extending the full length of said base and of lesser width than said base;
   (d) an emitter contact on the outer layer of said emitter;
   (e) a base contact on said semiconductor base and spaced from said emitter; and
   (f) a collector contact on the surface of said collector, whereby, when potentials are applied between said conductive contact on said collector and said emitter contact and between said emitter contact and said base contact, a laser beam is generated in said semiconductor base.

2. The transistor laser in accordance with claim 1 wherein said substrate is semi-insulating and said collector contact is disposed on the lower of said n layers of said collector, said lower layer being n+ and the upper layer thereabove being n−.

3. The transistor laser in accordance with claim 1 wherein said substrate is semiconducting and said collector contact is disposed on the outer surface thereof, said substrate being n+ and the semiconductor layers thereon being n+ and n−.

4. The transistor laser in accordance with claim 1 wherein said laser emits the laser beam through the outer surface of said collector, said substrate being an n+ semiconductor with a n+ and semiconductor layers thereon, at least one of said semiconductor layers comprising quarter wave stack providing a reflecting dielectric mirror on said substrate, and wherein said emitter has a semiconductor layer providing a reflecting dielectric mirror, thereby confining the lasing between said mirrors, and wherein said collector substrate permits the laser beam to pass through said mirror thereon and to exit therethrough.

5. The transistor laser in accordance with claim 4 wherein said dielectric mirrors are realized by quarter wave thick layers of compatible low and high index of refraction semiconductors.

6. The transistor laser in accordance with claim 4 wherein said substrate and its ohmic contact are configured to provide an aperture for the laser beam to exit.

7. The transistor laser in accordance with claim 1 wherein the laser beam generated in the base is of a wavelength to which the substrate is transparent.

8. The transistor laser in accordance with claim 1 wherein the ends of said base are reflecting to form a cavity therebetween and the laser beam is emitted through one end thereof.

9. The transistor laser in accordance with claim 1 wherein said emitter includes a multiplicity of resonant tunneling layers.

10. The transistor laser in accordance with claim 1 wherein positive distributed feedback is provided by periodic corrugation on at least one side of said base and said laser beam is emitted through one end thereof.

11. The transistor laser in accordance with claim 1 wherein said base is chemically constituted as a strained layer.

12. The transistor laser in accordance with claim 1 wherein said base provides multiple quantum wells.

* * * * *

UNITED STATES PATENT AND TRADEMARK OFFICE
CERTIFICATE OF CORRECTION

PATENT NO. : 5,239,550
DATED : August 24, 1993
INVENTOR(S) : Faquir C. Jain

It is certified that error appears in the above-indentified patent and that said Letters Patent is hereby corrected as shown below:

Column 6, line 10, please delete "upper".

Signed and Sealed this

Fifth Day of April, 1994

Attest:

BRUCE LEHMAN

*Attesting Officer*     *Commissioner of Patents and Trademarks*